United States Patent [19]

Okada et al.

[11] Patent Number: 4,855,102

[45] Date of Patent: Aug. 8, 1989

[54] SINTERING METHOD

[75] Inventors: Ryoji Okada, Niihari; Mitsuaki Haneda, Nishiibaraki; Takeshi Araya, Higashikurume; Susumu Hioki, Kashiwa, all of Japan

[73] Assignee: Hitachi, Ltd., Tokyo, Japan

[21] Appl. No.: 171,461

[22] Filed: Mar. 21, 1988

[30] Foreign Application Priority Data

Mar. 20, 1987 [JP] Japan ................................. 62-63848

[51] Int. Cl.$^4$ .............................................. B22F 7/00
[52] U.S. Cl. .......................................... 419/8; 75/247; 419/52; 419/23
[58] Field of Search ....................... 419/52, 63; 75/247

[56] References Cited

U.S. PATENT DOCUMENTS

| | | | |
|---|---|---|---|
| 1,848,438 | 5/1932 | Sieger et al. | 75/247 |
| 2,470,034 | 5/1949 | Hensal et al. | 75/247 |
| 3,606,766 | 9/1971 | Hill | 75/247 |
| 4,344,905 | 8/1982 | Chilcot | 419/31 |

*Primary Examiner*—Stephen J. Lechert, Jr.
*Attorney, Agent, or Firm*—Antonelli, Terry & Wands

[57] ABSTRACT

A sintering method and fusion welding method of the present invention are characterized in that energy is radiated to the black component of starting materials so as to convert it from the state of an energy absorber to the state of an energy reflector (the state where metallic luster is exhibited). The methods can be utilized effectively for forming the electrode of a sensor or the bump of an electronic component. When applied to the production of the sensor and the electrode, the methods can produce these products by a simple production process and with extremely high producibility.

14 Claims, 6 Drawing Sheets

SINTERING METHOD

BACKGROUND OF THE INVENTION

1. Field of the Invention

This invention relates to a sintering method, a fusion welding method, electronic components and sensors, and more particularly to a sintering method and fusion welding method capable of film formation and fusion welding without raising a substrate temperature, and to electronic components and sensors used in each of these methods.

2. Description of the Prior Art

Various metallic and non-metallic films are formed during a fabrication process of electronic components. These films are formed mainly by vacuum deposition, spattering, CVD, and the like, and plating and screen printing are also employed depending on fabrication conditions.

In the fabrication process of electronic components, there often occur the cases where the temperature of a substrate on which a film is to be formed cannot be raised but the film which is from several microns to a dozen of microns thick must be worked or etched in a predetermined shape. In such cases, vacuum deposition and spattering are not employed because a long period of time is necessary for forming the film, and an extended period of time is also required for etching unnecessary portions if the film thickness increases and accuracy drops. Particularly, vacuum deposition is not employed because the substrate is heated by radiation from a vacuum deposition source. Screen printing is not employed, either, because the substrate must be heated as a whole in order to bake a printed paste.

Therefore, plating is employed under the conditions such as described above. Though plating can form a film without heating the substrate, it is not free from the problems in that the substrate must be dipped into a plating solution, a long period of time is necessary for plating, process steps such as an electrode formation step, a photoresist step, and the like become complicated as a whole, the film thickness is likely to be non-uniform and the yield is low. Although these problems result in the increase in the cost of production, plating is employed at present under the above-mentioned conditions.

High cost of production is unavoidable in the case of plating because its process steps are complicated and its yield is low. Particularly because plating is a wet process, it renders various disadvantages to other process steps.

The technique disclosed in Japanese Patent Laid-Open No. 160975/1982 can be cited as a prior art reference related to the sintering technique which is proposed hereby by the present invention.

Sintering of ultra-fine particles by laser is known from this prior art reference (Japanese Patent Laid-Open No. 160975/1982) but this reference does not deal with ultra-fine metal powder as the object of laser radiation and cannot be applied to the fabrication of electronic components, for example.

On the other hand, mention can be made of U.S. Pat. No. 4,612,208 as a reference relating to laser radiation technique which is proposed by the present invention.

In accordance with this prior art technique, however, a lamp-black itself has no longer the trace of the original form by laser radiation, and the product or treated object is different from that of the present invention.

SUMMARY OF THE INVENTION

The present invention is directed to form a film or a linear or protrusive film by a dry and simple process without raising a substrate temperature, or to fusion-weld the film.

In a sintering method which sinters metallic powder or a mixture of the metallic powder and non-metallic powder by subjecting the powder to radiant energy, the first aspect of the present invention is characterized in that black ultra-fine particles are used as the powder and are converted from the state of an energy absorber before sintering to the state of an energy reflector after sintering.

In a fusion welding method which fuses and welds metallic materials with one another or a metallic material with other members by energy radiation, the second aspect of the present invention is characterized in that the surface of at least one of the metallic materials is black, and the surface of the metal is fused by energy radiation so that the black portion on the surface of the metal is varnished but exhibits metallic luster and the metal is thus converted from a light absorber to a light reflector.

In a sintering method which sinters metallic powder or a mixture of the metallic powder and non-metallic powder by radiating energy thereto, the third aspect of the present invention is characterized in that at least the surface of the powder as the object of energy radiation is black, and the black portion on the surface of the powder as the object of energy radiation is fused by radiating energy and is then sintered so that the radiated surface is converted from the state of the energy absorber before fusion and sintering to the state of an energy reflector after fusion and sintering.

In a fusion welding method which fuses and welds metallic materials with one another or a metallic material and other members by energy radiation, the fourth aspect of the present invention is characterized in that black metallic ultra-fine powder or a material containing such ultra-fine powder is disposed at the fusion-weld portion, and this fusion-weld portion is fused by radiating energy so that the fusion-weld portion is converted from the state of an energy absorber before fusion to the state of an energy reflector after fusion.

In a sintering method which sinters metallic powder or a mixture of the metallic powder and non-metallic powder by radiating energy thereto, the fifth aspect of the present invention is characterized in that black metallic ultra-fine particles are used as the metallic powder, and the progress of sintering of this portion by energy radiation is monitored by a sensor as an energy absorption factor and/or as an energy reflection factor.

In a fusion welding method which fuses and welds metallic materials with one another or the metallic material and other members by radiating energy thereto, the sixth aspect of the present invention is characterized in that the surface of at least one of the metallic materials is black, the surface of the metal is fused by energy radiation so that the black portion on the surface of the metal is varnished but exhibits metallic luster and is thus converted from a light absorber to a light reflector, and the progress of fusion of this portion by energy radiation is monitored as an energy absorption factor and/or as an energy reflection factor by a sensor.

In a sintering method which sinters metallic powder or a mixture of the metallic powder and non-metallic powder by radiating energy thereto, the seventh aspect of the present invention is characterized in that at least the surface of the powder as the object of energy radiation is black, and the black portion of the surface of the powder as the object of energy radiation is fused and then sintered by radiating energy thereto so that the radiated surface is converted from the state of an energy absorber before fusion and sintering to the state of an energy reflector after fusion and sintering.

In a fusion welding method which fuses and welds metallic materials with one another or the metallic material and other members by radiating energy thereto, the eighth aspect of the present invention is characterized in that black metallic ultra-fine powder or a material containing such ultra-fine powder is disposed at the fusion-welding portion, the fusion-welding portion is fused by radiating energy thereto so that the fusion-welding portion is converted from the state of an energy absorber before fusion to the state of an energy reflector after fusion, and the progress of sintering of this portion by energy radiation is monitored as an energy absorption factor and/or as an energy reflection factor by a sensor.

The ninth aspect of the present invention is characterized in that a layer containing black metallic ultra-fine particles is formed at a predetermined position on the surface of a substrate, and energy is then radiated to the layer so as to sinter the black metallic ultra-fine particles or the black metallic ultra-fine particles and other contents in a paste.

When bumps for connecting lead wires to an IC chip are formed, the tenth aspect of the present invention is characterized in that metallic powder is coated on the IC, the metallic powder contains black ultra-fine particles, and the coated film is sintered by radiating a laser beam thereto so that the ultra-fine particles are converted from the state of a laser beam absorber before sintering to the state of a laser beam reflector after sintering and the bumps are thus formed.

When bumps for connecting lead wires to an IC chip are formed, the eleventh aspect of the present invention is characterized in that metallic powder is coated on the lead wires, the metallic powder contains black ultra-fine particles, and the coated film is sintered by radiating a laser beam thereto so that the ultra-fine particles are converted from the state of a laser beam absorber before sintering to the state of a laser beam reflector after sintering and the bumps are thus formed.

When bumps for connecting lead wires to an IC chip are formed, the twelfth aspect of the present invention is characterized in that metallic powder is coated on the IC to form a metallic ultra-fine particle film, and this metallic ultra-fine particle film is sintered by radiating a laser beam thereto.

When bumps for connecting lead wires to an IC chip are formed, the thirteenth aspect of the present invention is characterized in that metallic powder is coated on the lead wires to form a metallic ultra-fine particle film, and this metallic ultra-fine particle film is sintered by radiating a laser beam thereto.

According to the tenth to thirteenth aspects of the invention described above, there can be obtained an electronic component which comprises the combination of a substrate made of an insulating material and an electrically conductive material, and wherein the electrically conductive material consists of a sintered body of metallic powder containing metallic ultra-fine particles or a mixture of the metallic powder and non-metallic powder.

In a sensor which includes a substrate made of an insulating material, electrodes and sensing member disposed on the substrate and a protective film disposed on the substrate in such a manner as to cover the electrodes and the sensing member, the fourteenth aspect of the present invention is characterized in that the electrode consists of a sintered body obtained by radiating energy to metallic powder containing black ultra-fine particles or a mixture of the metallic powder and non-metallic powder so as to convert the black component to an energy reflector. (Definition of starting ultra-fine powder)

The term "black" of the metallic ultra-fine powder represents powder whose reflection factor is below 50% of the reflection factor in bulk.

The starting ultra-fine powder represents ceramics and/or metallic ultra-fine powder.

The metallic ultra-fine powder (ultra-fine particles) is powder whose particle size is 0.01 ∼ 1 μm or below.

Radiation energy

The radiation source of energy is preferably a laser beam or an optical beam, but other electromagnetic waves such as solar rays converged by a lens, an electron beam, and so forth, can be used in the present invention.

The energy radiation quantity is preferably selected so that the progress of heating of the sintered portion is stopped or restricted upon completion of sintering and fusion described above.

The energy of the laser beam or the like to be radiated and the energy density of the radiated portion must be sufficient enough so that the metallic ultra-fine particle film can be sintered and fused. However, an extremely high energy density which evaporates instantaneously the thick film after sintering and applies damage thereto is not suitable. Therefore, the relation between the base material, the energy source and the radiation quantity (inclusive of the radiation time) must be adjusted appropriately.

In the following embodiments, YAG laser beam will be shown used as the applicable energy source by way of example, but the present invention can utilize not only such monochromatic light but also an optical beam using composite light. In short, the energy may be such that the energy absorption factor changes before and after sintering and fusion of the ultra-fine particle film and the black surface. In other words, the present invention can be applied not only to the laser beam but also optical energy including ultraviolet and infrared rays.

When a sensor is used, it is preferred to stop the energy radiation at the point of time when the radiated portion is converted from the energy absorber to the energy reflector through the sensing operation of this sensor.

Formation of the starting film

The ultra-fine particle containing layer described above is preferably coated in the paste form.

Alternatively, it is preferred to form a film of a material having a high reflection factor to the radiation energy on the substrate surface before the formation of the ultra-fine particle containing layer on the substrate surface.

Furthermore, it is preferred to form a film which improves wettability of the sintered body, which is obtained by the energy radiation, and the substrate on the substrate surface before the formation of the ultra-fine particle containing layer on the substrate surface.

The paste described above is preferably printed and coated in a predetermined pattern.

On the other hand, it is effective to wipe off other unsintered portions after sintering is made by radiating energy to the ultra-fine particle containing layer described above.

Applied products

The present invention is suitable for electronic components and is most suitable, in particular, for the bump portions of a packaged article of an IC chip by TAB (Tape Automated Bonding). The present invention is also effective for forming conductor films and/or wirings such as a micro-circuit wiring and multi-layered wiring substrate such as an IC chip.

The application example of the invention to the electronic components such as TAB as a typical example comprises forming the substrate as an insulating film, disposing a conductor wiring on the film, connecting the end portion of the conductor wiring to the upper surface of the IC chip at the bump and rendering the bump the sintered body described above.

The typical application example of the invention to the sensor is that the electrode in the fourteenth aspect of the present invention described above is a heat ray flow meter which functions also as the sensing member described above.

Formation method of bump

A preferred embodiment of the bump formation represented in the tenth to thirteenth aspects of the invention is as follows.

(1) A film made of a material having a high reflection factor to a laser beam and high wettability to the sintered body obtained by the laser beam radiation, that is, the bump, is formed on the IC surface before the formation of the metallic ultra-fine particle film on the IC surface.

(2) When the metallic powder is coated on the IC surface, at least two kinds of metallic powder are coated separately and a multi-layered metallic ultra-fine particle film is formed.

(3) The metallic powder is further coated on the surface of the bump that is once formed, in order to form another metallic ultra-fine particle film, and the laser beam is again radiated to this bump and the metallic ultra-fine particle film is sintered.

(4) A film made of a material having a high reflection factor to a laser beam and high wettability to the sintered body obtained by the laser beam radiation, that is, the bump, is formed on the IC surface before the formation of the metallic ultra-fine particle film on the IC surface.

(5) When the metallic powder described above is coated on the lead wire surface, at least two kinds of metallic powder are coated separately and a multi-layered metallic ultra-fine particle film is formed.

Screen printing method

Screen printing can form a film by a simple dry process with a high level of accuracy. Therefore, the object described above can be accomplished by sintering the film which is formed by screen printing and which is under an unsintered state, either at a low temperature or without heating the substrate as a whole.

Action

The action of the invention in the case of the black metallic ultra-fine powder by way of example, is as follows.

When the metallic powder is pulverized and milled to ultra-fine particles, the light absorption factor increases and sintering by laser beam radiation becomes easy. Therefore, the laser radiation time becomes shorter remarkably and since the vacuum deposition film having a high reflection factor is formed at portions other than the sintered portion, heating of the substrate by laser radiation can be more easily checked. Since the metallic ultra-fine particle film turns to a high optical reflector after sintering, it is not heated unnecessarily and prevents heating of the substrate.

DESCRIPTION OF THE PREFERRED EMBODIMENTS

Hereinafter, preferred embodiments of the present invention will be described with reference to the accompanying drawings.

Embodiment 1

Figure 1:
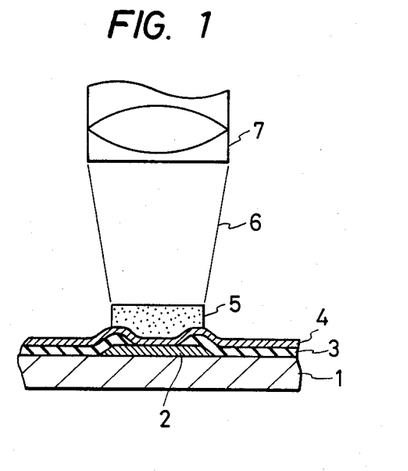
FIGS. 1, 7, 13, 19 and 22 are sectional views of electronic components on which a gold bump is formed by laser beam radiation by the sintering method in accordance with one embodiment of the present invention.

FIG. 1 shows a sintering method of gold ultra-fine powder by laser beam radiation in accordance with one embodiment of the present invention.

In the drawing, reference numeral 1 represents a silicon substrate; 2 is an aluminum wiring; 3 is an insulating protective film; 4 is a gold vacuum deposition film; 5 is a gold ultra-fine powder film; 6 is a laser beam; and 7 is a laser oscillator.

Figure 2:
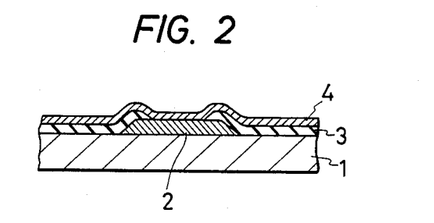
FIG. 2 is a sectional view of a substrate as the material of the embodiment shown in FIG. 1.
Figure 3:
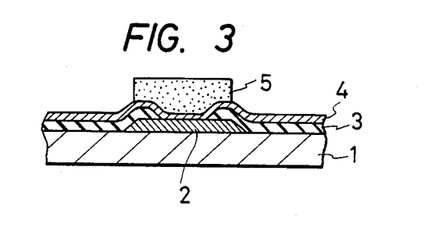
FIG. 3 is a sectional view of the substrate of FIG. 2 on which a gold ultra-fine particle film is coated.

FIG. 2 is a sectional view of the substrate before the gold ultra-fine powder film 5 is formed and FIG. 3 is a sectional view of the substrate after the gold ultra-fine powder film 5 is formed in FIG. 2.

Gold is originally a high light reflector and reflects about 95% of YAG laser (wavelength 1.06 $\mu$m) and about 98% of $CO_2$ laser (wavelength 10.6 $\mu$m). When turned to ultra-fine particles, however, gold becomes black and a high light absorber having an extremely high absorption factor. Metals in general become high light absorbers when they are turned to ultra-fine particles. Part of the present invention utilizes the characteristics of metals described above and sinters ultra-fine powder by laser radiation.

First of all, a gold (Au) thin film is formed on an IC chip as shown in FIG. 2. There is no limitation to the film formation method; hence, sputtering, vacuum deposition, CVD, or the like, can be employed.

Next, a paste prepared by Au ultra-fine powder is printed as shown in FIG. 3, heated in the atmosphere of an inert gas, in the $N_2$ atmosphere or in the air to about 400° C. and is then dried.

The Au ultra-fine powder thus dried is then subjected to laser radiation for an extremely short period of at most a few seconds and is sintered as shown in FIG. 1. In this manner, a gold bump having a size of about 100 $\mu$m by 100 $\mu$m and a height of about 20 $\mu$m is formed. There is no limitation to the laser, in particular, and YAG laser, $CO_2$ laser, glass laser, or the like, can be employed. In this instance, the Au vacuum deposition film formed on the IC chip reflects the laser beam at portions other than at the Au ultra-fine powder film and prevents the temperature rise of the IC chip. Since Al has low wettability to Au, sufficient bonding strength cannot be obtained between the Al wiring and the gold bump after sintering by laser radiation if Au ultra-fine powder is directly coated on the Al wiring. If the Au vacuum deposition film is formed in advance, however, the Au bump and the Al wiring can be bonded sufficiently. The vacuum deposition film may be formed as the material providing the bonding strength between the Au bump and the Al wiring besides the Au vacuum deposition film, such as Pd, for example.

As described above, it is possible in accordance with the present invention to form the Au bump while the IC chip is kept at a low temperature because the laser radiation portion is extremely small, because the laser radiation time is extremely short, because the Au vacuum deposition film on the IC chip reflects the laser beam at portions other than the Au ultra-fine powder film and because the metallic ultra-fine powder film becomes a high light reflector after sintering and its energy absorption after sintering drops.

In accordance with this embodiment, the Au bump can be formed on the IC chip with extremely high reproducibility by a simple dry step.

Figure 4:
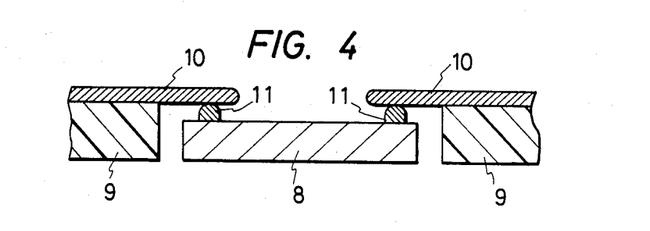
FIG. 4 is a sectional view of an IC chip package obtained by the embodiment of FIG. 1.
Figure 5:
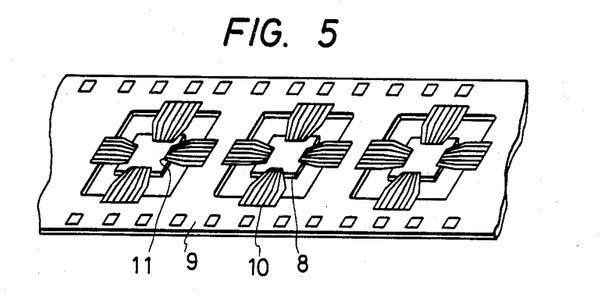
FIG. 5 is a perspective view of the package shown in FIG. 4.

FIG. 4 is a sectional view of the TAB package obtained by the embodiment described above and FIG. 5 is its plan view. In the drawings, reference numeral 8 represents the IC chip; 9 is a polyimide film; 10 is a copper lead; and 11 is the Au bump.

The TAB packaging method is an indispensable technique for various thin office automation (OA) equipment, pocket calculators and IC cards of the latest type for which limited thinness is of utmost importance because the TAB packaging method can reduce the thickness and size of IC devices and can increase the number of pins.

In accordance with the prior art technique, a thin copper film is first bonded onto a polyimide film and copper leads are then formed by etching. On the other hand, an Au pad (hereinafter called the "bump") having a size of about 100 $\mu$m by 100 $\mu$m and a thickness of from about 20 to about 30 $\mu$m is formed by plating on the aluminum wiring of the CI chip which is to be connected to the copper lead. The Au bump and the copper lead are bonded together by bonding and the IC chip is mounted onto the 35 mm-thick polyimide film. Since the IC chip cannot be heated to a temperature higher than 450 ° C., the Au bump must be formed by plating which does not raise the substrate temperature. As described already, however, the plating method requires generally troublesome and long process steps such as (1) formation step of plating electrode, (2) photoresist step, (3) plating step, (4) removing step of photoresist and (5) etching step of electrode. Moreover, nonuniformity of the height of the Au bumps is likely to cause defective connection with the copper lead and the production yield drops consequently.

The problems of the prior art technique described above can be solved by adopting the embodiment of the invention shown in FIGS. 1 to 3.

Embodiment 2

The formation step of the Au bump on the copper lead in accordance with another embodiment of the present invention will be described with referenced to FIGS. 6 to 8.

Figure 6:
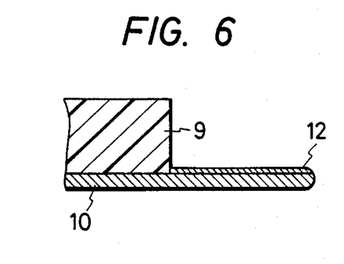
FIG. 6 is a sectional view of a substrate as the material of the embodiment shown in FIG. 7.
Figure 7:
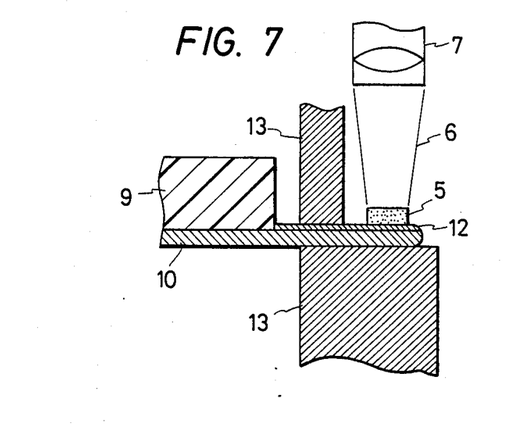

In FIGS. 6 and 7, reference numeral 10 represents the copper lead; 9 is the polyimide film; 12 is an Sn vacuum deposition film; 5 is an Au ultra-fine powder film; 13 is a copper block; 6 is a laser beam; and 7 is a laser oscillator.

The Au bump must be formed at a low temperature because the polyimide film cannot withstand a temperature higher than about 450° C. in the same way as the IC chip.

First of all, the Sn vacuum deposition film is formed on the copper lead as shown in FIG. 6. There is no limitation, in particular, to the formation method of the Sn vacuum deposition film. Therefore, the film may be formed by vacuum deposition, spattering or plating.

Next, as shown in FIG. 7, a paste prepared from the Au ultra-fine powder is printed, heated to about 400° C. in an inert gas atmosphere or an $N_2$ atmosphere and then dried. Next, as shown in FIG. 7, the copper lead is clamped by the copper blocks from above and below and the Au ultra-fine powder film is sintered by the laser beam in an inert gas atmosphere such as of $N_2$ or Ar for a short period not exceeding a few seconds at most, thereby forming the Au bump. In this case, the copper block absorbs the heat due to the laser beam radiation and prevents heating of the polyimide film. The Sn vacuum deposition film causes the eutectic reaction with the Au bump and generates sufficient bonding strength.

Laser beam radiation must be carried out in an inert gas atmosphere of $N_2$ or Ar in order to prevent oxidation of the copper lead and the Sn vacuum deposition film.

Figure 8:
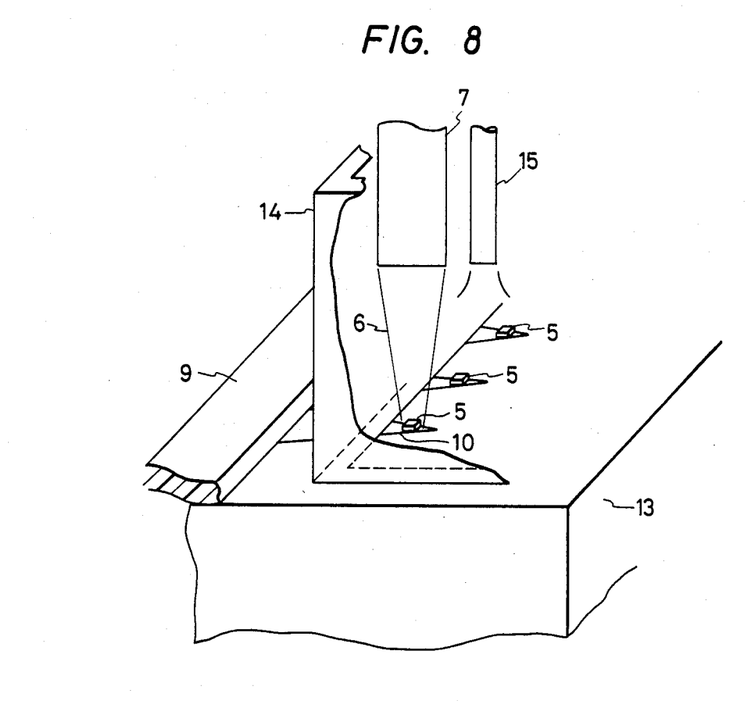
FIG. 8 is a partial perspective view of an electronic component on which a gold bump is formed by laser beam radiation by the sintering method in accordance with another embodiment of the present invention.

FIG. 8 shows an example of a production apparatus. In FIG. 8, reference numeral 10 represents the copper lead on which the Sn vacuum deposition film is formed; 9 is the polyimide film; 5 is the Au ultra-fine powder film; 13 is the copper block; 14 is the copper block which as the shape of a square cylinder; 7 is the laser oscillator; 15 is a pipe; and 6 is the laser beam. The copper lead to which the laser must be radiated is clamped between the copper blocks from above and below, and $N_2$ or Ar is blown inside the copper block having the form of the square cylinder through the pipe so that only the periphery of the laser radiation portion is encompassed by the $N_2$ or Ar atmosphere. In accordance with this method, the Au bump can be formed on the copper lead even in the air.

As described above, it is possible in accordance with this embodiment to form the Au bump with high producibility while the polyimide film is kept at a low temperature because the laser radiation portion is extremely small, because the laser radiation time is short, because the copper blocks absorb the heat and because the reflection factor of the Au ultra-fine powder film increases but its absorption factor drops after sintering.

Embodiment 3

Still another embodiment of the present invention will be described with reference to FIGS. 9 and 11.

When the electrodes are to be connected mutually after completion of the IC chip, it is not efficient to form the Al wiring through the ordinary steps of photoresist, Al vacuum deposition and etching. Since the IC chip has already been completed, the substrate temperature cannot be raised and screen printing which is otherwise highly efficient cannot be employed.

Figure 9:
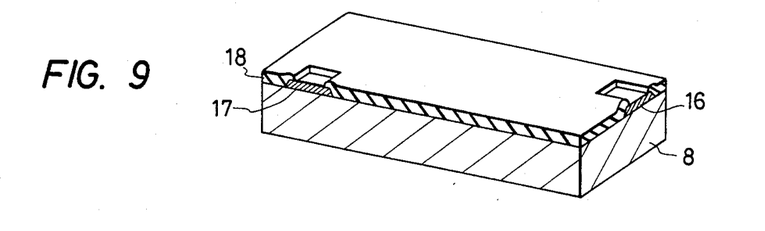
FIG. 9 is a perspective view of a substrate on which micro-wiring is disposed by the sintering method in accordance with an embodiment of the present invention.
Figure 10:
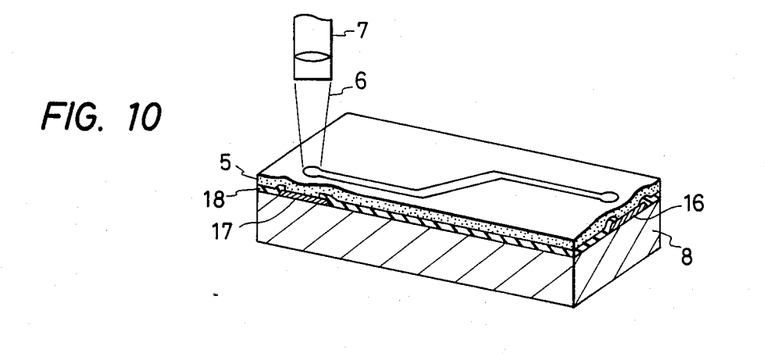
FIG. 10 is a perspective view of the substrate of FIG. 9 during the radiation of the laser beam to the substrate.
Figure 11:
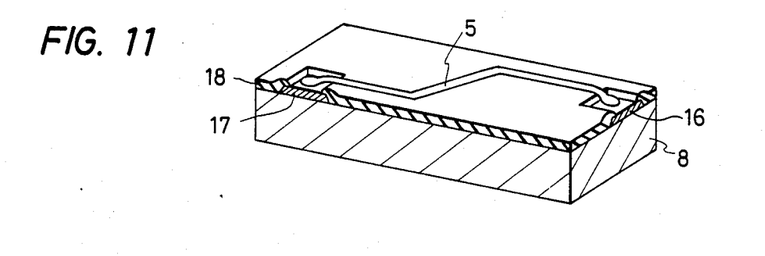
FIG. 11 is a perspective view of the substrate with the wiring obtained by the step shown in FIG. 10.

FIGS. 9 to 11 show schematically the formation step of the Au wiring on the IC chip in accordance with this embodiment. In these drawings, reference numeral 8 represents the IC chip; 16 and 17 are the electrodes which are to be connected by the Au wiring; 18 is an insulating protective film; 5 is the Au ultra-fine powder film; 6 is the laser beam; and 7 is the laser oscillator.

First of all, the Au ultra-fine powder film is coated between the electrodes to be connected, as shown in FIG. 10. In this case, only the Au ultra-fine powder film may be coated or a paste using the Au ultra-fine powder may be coated. After the Au ultra-fine powder film is formed, either the laser beam or the IC chip is moved and the laser beam is radiated in such a manner as to connect the electrodes and to sinter only the wiring portion that connects the electrodes. After laser radiation, the unsintered portions of the Au ultra-fine particle film are removed by water or an organic solvent, as shown in FIG. 11.

As described above, it is possible in accordance with this embodiment to form efficiently the Au wiring having an arbitrary shape while the substrate temperature is kept at a low level because the laser radiation time is short and because the Au ultra-fine powder film becomes a high light reflector after sintering and does not absorb excessive heat. When the Au wiring is formed, it is possible to form it efficiently by printing only the wiring portion and sintering it by laser radiation after drying in the same way as the Au bump formation method described above.

In the case of the Au thin film formed by coating an Au ultra-fine particle film on the silicon substrate on which an Au vacuum deposition film is formed and then radiating the laser beam to sinter the film in the disc-like shape having a diameter of about 1 mm, the photograph of the appearance of the film shows that the gold disc-like portion consists of the Au thin film sintered by laser radiation and the surrounding black portion consists of unsintered Au ultra-fine particle film. The laser used in this case is the YAG laser and the radiation time is about one second. Bonding strength with the substrate after sintering is high and the film does not peel even after a tape test.

Though the Au bump is shown formed on the Al wiring in this embodiment, the conductive metals other than Al, such as Cu, Sn, Ag, Au, and the like, can also be used. The bump material may be those metals which are black in the form of ultra-fine particles but change reflective after sintering, such as Ag, Cu, Al, and the like, besides Au.

In accordance with the wiring method of the embodiment shown in FIGS. 9 to 11, it is possible to form a multi-layered wiring by repeating similar wiring on insulating layers.

Furthermore, in FIG. 10, the metal film can be formed by sintering a wider area by scanning a laser beam or a chip.

Though this embodiment uses the laser beam, other heat sources (electron beam, infrared rays, plasma, optical beam, etc.) whose energy charge quantity changes before and after sintering of the ultra-fine particles may also be used.

Verification 1

Figure 12:
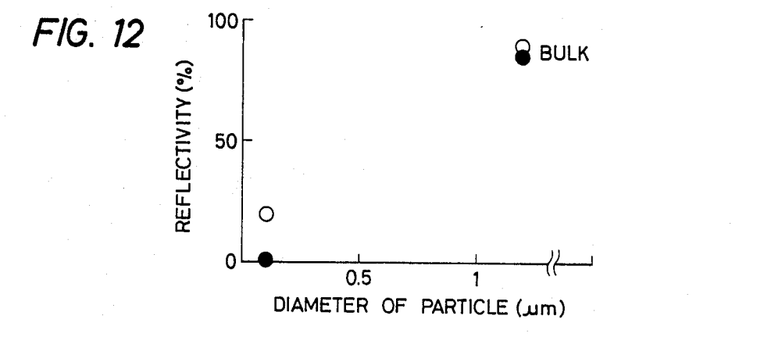
FIG. 12 is a characteristic diagram showing the reflection factor of a ultra-fine particle film in comparison with that of a bulk.

FIG. 12 shows the relation between the reflection factor of light and the diameter of the ultra-fine particles when the gold ultra-fine particles are coated in the film form. Symbol ● represents the reflection factor to the ray of light having a wavelength of 0.9 to 1.1 $\mu$m, and symbol ○ represents the reflection factor to the rays of light having a wavelength of 9 to 11 $\mu$m. The gold ultra-fine particle film having a mean particle diameter of about 100 Å absorbs almost all the rays of light corresponding to the YAG laser wavelength (1.06 $\mu$m). It is also a high absorber for the rays of light corresponding to the $CO_2$ laser wavelength (10.6 $\mu$m). For comparison, the diagram shows also the reflection factor of gold in bulk (mirror surface) to the rays of light having the same wavelength. Gold in bulk exhibits an extremely high reflection factor to the rays of light of either wavelength. This embodiment sinters the film by laser radiation by utilizing the characteristics of the reflection factor described above and the characteristics of low temperature sinterability of the metallic ultra-fine particles.

Embodiment 4

Figures 13, 14, 15, 16, 17:
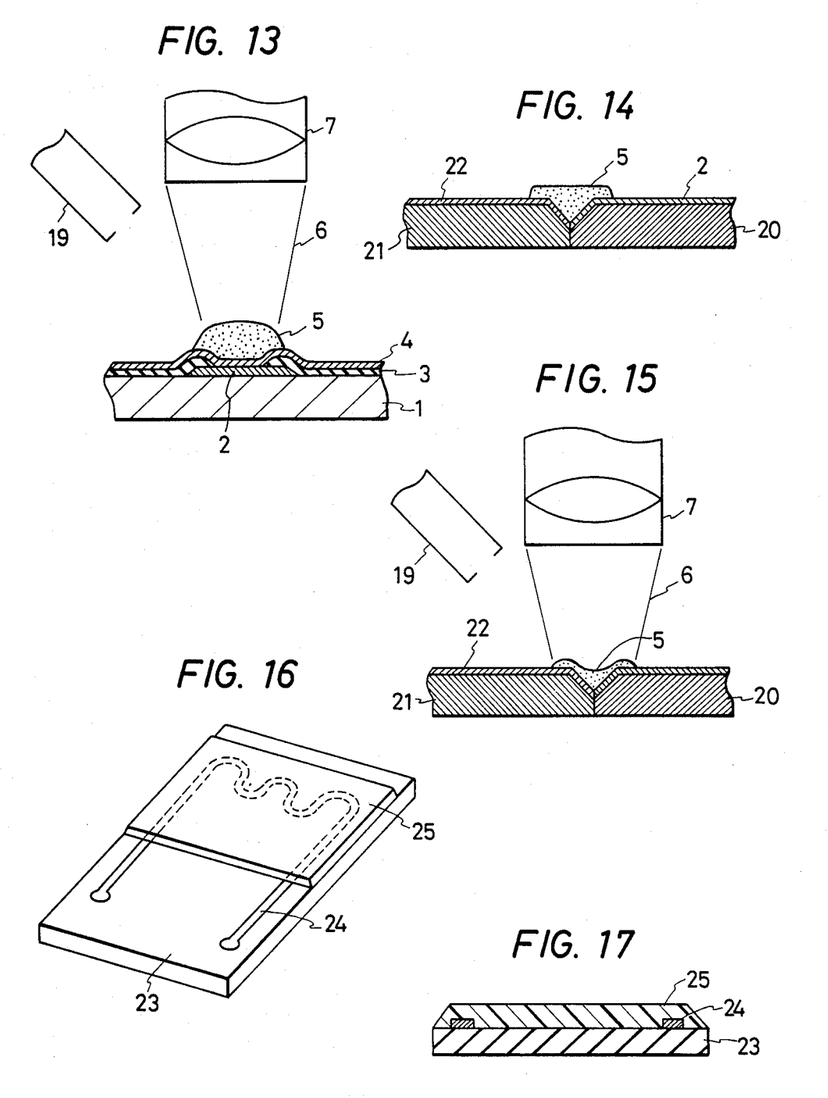
FIG. 14 is a sectional view of an object of bond before it is fusion-welded by the fusion-welding method in accordance with another embodiment of the present invention.
FIG. 15 is a sectional view of the object of bond showing the fusion-welding step by radiating a laser beam to the object of the bond.
FIG. 16 is a perspective view of a sensor in accordance with still another embodiment of the present invention.
FIG. 17 is a sectional view of the embodiment shown in FIG. 16.

FIG. 13 shows a modified embodiment of FIG. 1. In the drawing, reference numeral 9 represents a reflectivity meter (sensor).

Originally, gold is a high reflector of light. As shown in FIG. 12, it reflects about 95% of the YAG laser (wavelength: 1.06 μm) and about 98% of the $CO_2$ laser (wavelength: 10.6 μm). When converted to the ultra-fine particles, however, gold becomes a high absorber of light. Generally, metals become high absorbers of light when they are converted to the ultra-fine particles.

The difference of this embodiment from the embodiment shown in FIG. 1 lies in that the progress of sintering is sensed appropriately by a sensor by utilizing the characteristics described above.

Namely, a laser beam is radiated to a dried Au ultra-fine powder film for an extremely short period of up to a few seconds as shown in FIG. 13 so as to sinter the film within an extremely short period and a gold bump which has a shape of about 100 μm by about 100 μm and which is about 20 μm high is formed. The reflection factor of the gold ultra-fine particle film is measured by the reflectivity meter at the time of laser radiation. The progress of sintering of the ultra-fine particle film is estimated from the reflection factor (reflectively) thus measured and the output and radiation time of the laser beam are controlled. The subsequent steps are substantially the same as those of the first embodiment.

Embodiment 5

Still another embodiment of the present invention will be described with reference to FIGS. 14 and 15.

As shown in this embodiment, the present invention can be applied to micro-bonding while keeping the bond portion at a low temperature besides the formation of the bump, the wiring and the thick film. An application example of the present invention to micro-bonding will be described with reference to FIGS. 14 and 15. In these drawings, reference numerals 20 and 21 represent articles as the objects of bonding; 22 is an Au vacuum deposition film; 5 is an Au ultra-fine particle film; 6 is a laser beam; 7 is a laser oscillator; and 19 is a measuring element of a reflectivity meter.

It is generally extremely difficult to bond articles as the objects of bonding when they are extremely small in size and cannot be heated depending on other conditions. This embodiment is particularly effective in such a case. First of all, the Au vacuum deposition film is formed on each article in order to protect the article and to improve wettability with the Au ultra-fine particle film. Next, as shown in FIG. 14, the Au ultra-fine particle film is printed onto the bond portions. After the film is dried, a laser beam is radiated for an extremely short period of up to a few seconds to the Au ultra-fine particle film which is printed on the bond portion so as to sinter the Au ultra-fine particle film and to bond the bond portions, as shown in FIG. 15.

Bonding can be made while the substrate is kept at a low temperature because the laser radiation time is extremely short and the laser beam is reflected by the Au vacuum deposition film at portions other than Au ultra-fine particle film. (The above represents the application of the invention to bonding).

Though the foregoing embodiments represent the case where the paste consisting of the Au ultra-fine particles is used, it is not necessary that all the Au particles in the paste are ultra-fine particles. In other words, it is possible to use a paste consisting of a mixture of gold small particles and gold ultra-fine particles, a mixture of ceramic powder and gold ultra-fine particles, and so forth . . . (use of mixed powder).

Embodiment 6

Next, an application example of the present invention to a sensor will be described with reference to FIGS. 16 and 17. In these drawings, reference numeral 23 represents a ceramic substrate; 24 is a detection portion, that is, an electrode; and 25 is a protective film. This embodiment shows an example of a heat ray flow meter for detecting a gas flow rate or for measuring a temperature.

In sensors such as a thermometer and a gas flow meter, a detection portion is formed by (1) fixing a thin metallic wire, (2) printing an electrically conductive paste, (3) plating a wiring and (4) spattering or the like. Resistance change of the detection portion is utilized for measuring the temperature and the change of the resistance value, due to the temperature change which results from a gas stream, of the detection portion heated to a predetermined temperature, is utilized for measuring the gas flow rate. In the present invention, ultra-fine particles of metals such as platinum, nickel, copper, gold, and the like, are printed or coated on a ceramic substrate such as $Al_2O_3$, SiC, AlN (as shown in the drawing) and are then subjected to radiation by laser beam, optical beam or other optical energy, whereby sintering proceeds by the energy charged into the blank ultra-fine particles and the particles change to a metal. As a result, the reflection factor becomes great, the application of energy is self-controlled and sintering is complete.

The wiring must be kept elongated in order to improve sensitivity, but a long and continuous detection portion can be obtained by swinging the optical energy or the sample as shown in the drawing. It is advisable to use a material (SiC, AlN, $Al_2O_3$, quartz, diamond, etc.) having a large electrical resistance and high thermal conductivity as the protective film of the substrate and the detection portion.

Incidentally, the use of Sic, AlN, $Al_2O_3$, or the like, is effective as the protective film.

Embodiment 7

Figure 18:
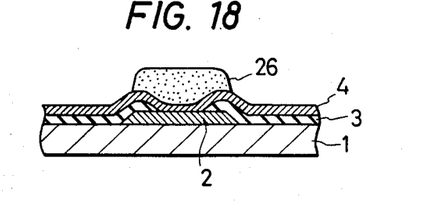
FIG. 18 is a sectional view of a substrate as a material of still another embodiment shown in FIG. 19.
Figure 19:
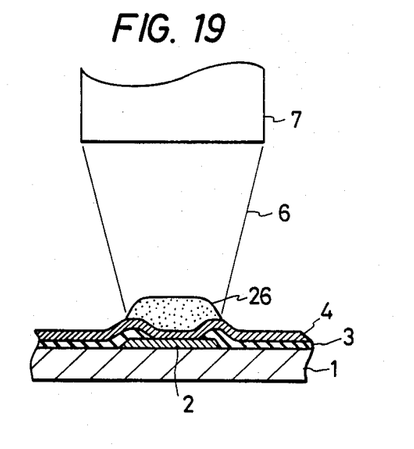
Figure 20:
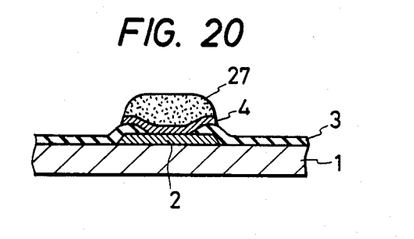
FIG. 20 is a sectional view after the bump is formed on the substrate shown in FIG. 18.

A bump formation method in accordance with still another embodiment of the present invention will be described with reference to FIGS. 18 to 20. In these drawings, reference numeral 1 represents an IC chip (silicon substrate); 26 is a bump starting material, which is a gold paste consisting of gold small particles in this embodiment; 2 is an aluminum wiring; 3 is an insulating film; 4 is a gold vacuum deposition film; 6 is a laser beam; and 7 is a laser oscillator. Incidentally, this embodiment uses the YAG laser. FIGS. 18 to 20 are longitudinal sectional views showing the bump formation steps.

First of all, a gold thin film which is a high reflector of the YAG laser is formed on the entire portion of the IC. The film may be formed by any method without limitation, such as vacuum deposition or spattering.

Next, a gold paste is printed in the bump form by screen printing on the aluminum wiring to be connected to a lead wire. In this embodiment, the printed film has a size of 100 μm by 100 μm and a height of 10 to 20 μm (see FIG. 18).

After printing, heating is made within a tolerable range of the IC so as to remove an organic solvent inside the paste. This embodiment uses the gold paste whose mean particle diameter is about 1.5 μm. Alternatively, the printed film is kept at about 380° C. for about 10 minutes in the atmosphere after printing so as to remove the organic solvent in the gold paste.

After the organic solvent is removed, the YAG laser beam is radiated to the dried gold print film as shown in FIG. 19 and sintered so as to form the gold bump. This embodiment uses the laser beam having a beam diameter of from 1 to 5 mm and the energy density is within the range of 0.5 to 1.5 $J/mm^2$. The laser radiation time is from 0.1 to 2 ms.

After the printed film is sintered, the gold thin film 4 formed on the entire surface of the IC at portions other than on the bump is removed.

The apparatus shown in FIG. 8 can be used for forming the bump on the lead wire in accordance with this embodiment. In such a case, the gold paste is first of all printed in the bump form at the tip of the lead wire 10 by screen printing. After printing is made, heating is made at a temperature within a tolerable range of the polyimide film 9 so as to remove the organic solvent in the paste. The printed film is kept at about 380° C. for about 20 minutes in a nitrogen atmosphere in this embodiment. Next, the lead wire is clamped from above and below the copper blocks 13 and 14. An inert gas is blown from the pipe 9 into the portion encompassed by the copper blocks in order to prevent the oxidization of the copper lead by the laser beam radiation and to establish the inert gas atmosphere. In this inert atmosphere, the desired gold film is sintered by radiating the YAG laser beam thereto to form the gold bump. In this instance, the copper blocks 13 and 14 absorb the heat of the copper lead which is heated by the laser radiation and prevent heating of the polyimide film 9 which is not highly resistant to heat. In this embodiment, the radiation time of the laser beam is from 0.1 to 2 ms and the energy density is from 0.5 to 1.5 $J/mm^2$. The atmosphere is of the nitrogen atmosphere.

Embodiment 8

When the gold bump and the copper lead wire formed on the IC are bonded together, it is effective to form a metallic film which improves their bonding on the gold bump and on the copper lead. Hereinafter, still another embodiment of the present invention, wherein the metallic film for improving boding strength is formed on the bump, will be described with reference to FIGS. 21, 22 and 23.

Figure 21:
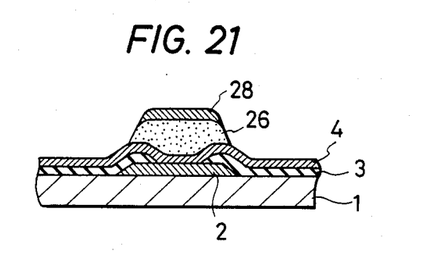
FIG. 21 is a sectional view of a substrate as the material of the embodiment shown in FIG. 22.
Figure 22:
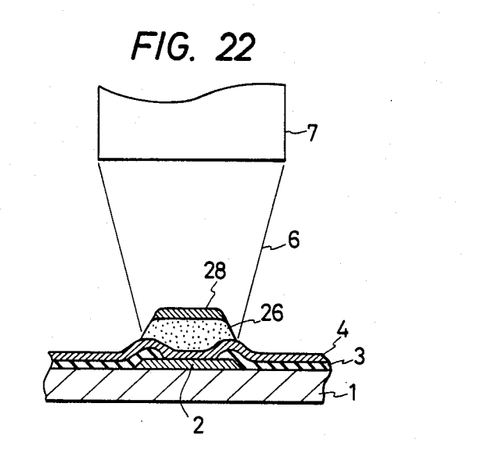
Figure 23:
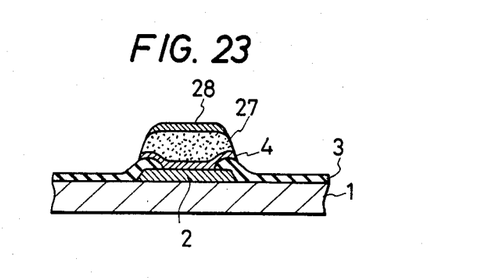
FIG. 23 is a sectional view after the bump is formed on the substrate shown in FIG. 21.

In these drawings, reference numeral 1 represents the IC chip; 26 is the gold paste; 27 is the gold bump; 2 is the aluminum wiring; 3 is the insulating film; 4 is the gold thin film; 6 is the laser beam; 7 is the laser oscillator; and 28 is the thin film for improving bonding between the lead wire and the bump, which is a tin thin film in this embodiment.

First of all, a tin paste consisting of tin ultra-fine particles is printed on the gold bump. After printing, the printed paste is heated within a tolerable temperature range of IC inside an inert gas so as to remove an organic solvent in the tin paste. The dried and printed tin film is instantaneously sintered by radiating the YAG laser beam thereto to form the tin thin film on the gold bump. In this embodiment, the laser radiation time is from 0.1 to 2 ms and the energy density is from 0.1 to 1 $J/mm^2$. Since the heating time is extremely short in this embodiment, the alloying reaction takes place on only the interface between the tin thin film and the gold bump and about 1 μm-thick tin thin film can be formed on the gold bump with an extremely high level of bonding strength. In accordance with ordinary sintering methods which use a heating furnace, the tin thin film and the gold bump cause always the eutectic reaction so that the tin thin film cannot be formed.

In accordance with this embodiment, heating can be made locally and instantaneously by use of the laser beam and the printed film can be sintered without heating other portions than the printed film. In addition, the high reflector film of the laser beam, which has in advance been formed before the formation of the printed film, reflects the laser beam radiated to the portions other than the printed film, prevents heating of those portions and protects the IC. Since the printed film consisting of the metallic particles becomes the highest reflector of the laser beam after sintering, the excessive laser beam radiated after sintering is reflected and any unnecessary heating does not take place.

Since the bump can be formed with extremely high producibility in accordance with this embodiment, a drastic reduction of production cost can be accomplished in the TAB packaging method. From some dozens to some hundreds of bumps exist in the IC for TAB packaging which is a few millimeters square, but only a few seconds of time is necessary to sinter all the bumps of this IC in accordance with the method of this embodiment by sintering some dozens of bumps by use of a laser beam which is a few millimeters in diameter, because the laser beam radiation time necessary for sintering in this embodiment is only a few milliseconds. Furthermore, since the bump that has been sintered is a high reflector of the laser beam, no adverse influences are exerted even if the laser beam radiation is carried out superposedly, and this is extremely advantageous.

Verification 2

FIGS. 24 to 27 are photographs showing how the gold ultra-fine particles constituting the gold printed film have changed due to the laser radiation.

Figure 24:
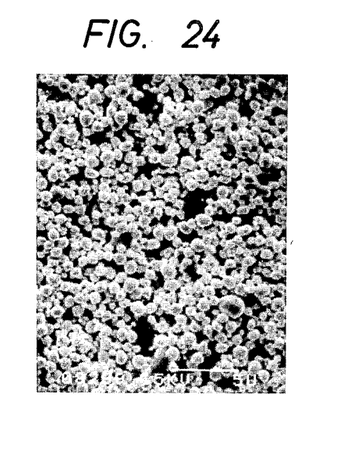
FIG. 24 is a photograph showing the result of surface observation on the gold print film which is printed and dried on the IC surface before laser radiation.
Figure 26:
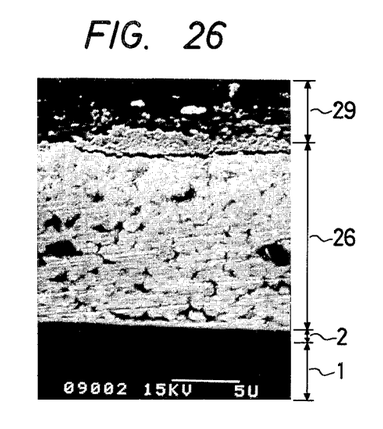
FIG. 26 is a photograph showing the result of observation of the section of the gold print film printed and dried on the IC surface before laser radiation.

FIG. 24 is a surface observation photograph of the gold printed film before laser radiation which is printed and dried on the IC surface, and FIG. 26 is its sectional observation photograph.

Figure 25:
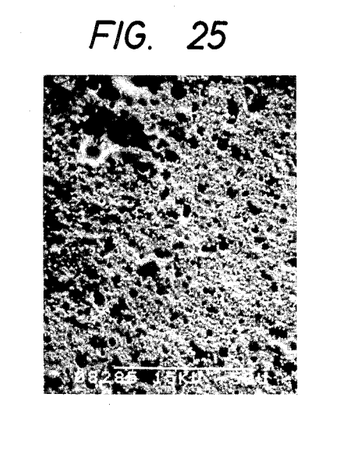
FIG. 25 is a photograph showing the result of surface observation of the gold print film about laser radiation.
Figure 27:
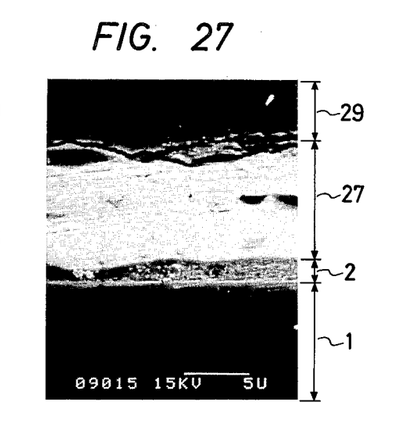
FIG. 27 is a photograph showing the result of observation of the section of the gold print film after laser radiation.

FIG. 25 is a surface observation photograph of the gold printed film after laser radiation which is printed and dried on the IC surface, and FIG. 27 is sectional observation photograph.

Reference numeral 29 in FIGS. 26 and 27 represents resin used for fixing the substrate for the convenience's sake.

As can be seen from FIGS. 24 and 26, the gold printed film consists of the laminate of the gold ultra-fine particles having a mean particle diameter of about 1.5 μm before the laser beam radiation. After the laser radiation, however, the gold ultra-fine particles are fused with one another, as can be seen from FIGS. 25 and 27, and form a compact thick film. As can also be seen from FIG. 27, fusing occurs up to the lowermost particles (or the particles at the bottom) in the longitudinal direction. Incidentally, the YAG laser is used as the laser, the radiation time is 1 ms and the power density is about 0.8 j/mm².

What is claimed is:

1. A method for sintering ultra-fine metallic powder or a mixture of said ultra-fine metallic powder and ceramic powder by the application of radiant energy which comprises providing a powder comprising black ultra-fine metallic particles or a mixture of black ultra-fine metallic particles and ceramic particles, said black ultra-fine metallic particles exhibiting a reflection factor below 50% of the reflection factor in bulk and exposing said powder to irradiation to sinter said powder and to convert said black ultra-fine metallic particles from the state of an energy absorber to the state of an energy reflector in the sintered product, said black ultra-fine metallic particles having a particle size ranging from 0.01 to 1 μm or below.

2. A sintering method according to claim 1, wherein the quantity of said radiant energy is selected in such a manner as to stop or check the progress of heating of said sintered product with completion of said sintering.

3. A sintering method according to claim 1, wherein a radiation source of said radiant energy is selected from a laser beam and an optical beam.

4. A sintering method according to claim 1, wherein at least the surface of said black ultra-fine metallic particles exhibits a black color.

5. A sintering method according to claim 1, wherein said powder comprises black ultra-fine metallic particles and the progress of sintering of the sintered product by said radiant energy is sensed by a sensor as at least one of an energy absorption factor or an energy reflection factor.

6. A sintering method according to claim 5, wherein said radiant energy is stopped at the point of time when said sensor senses that said sintered black ultra-fine metallic particles change from an energy absorber to an energy reflector.

7. A sintering method according to claim 1, wherein said powder in the form of a paste is formed at a predetermined position on the surface of a substrate.

8. A sintering method according to claim 7, wherein said powder is coated on said substrate.

9. A sintering method according to claim 7, wherein a film of a material having a high reflection factor to said radiant energy is formed on the surface of said substrate before the formation of said powder on said substrate.

10. A sintering method according to claim 7, wherein a film for improving wettability between the sintered body obtained by said energy radiation and said substrate is formed in advance on the surface of said substrate before the formation of said layer containing said ultra-fine particles on the surface of said substrate.

11. A sintering method according to claim 8, wherein said powder is printed and coated in a predetermined pattern.

12. A sintering method according to claim 7, wherein only a portion of said powder is sintered by said radiant energy and unsintered portions are removed.

13. A sintering method according to claim 7, wherein the quantity of said radiant energy is selected in such a manner as to stop or check the progress of heating of said sintered product with completion of said sintering.

14. A sintering method according to claim 7, wherein a radiation source of said radiant energy is selected from a laser beam and an optical beam.

* * * * *